(12) United States Patent
Paprotny et al.

(10) Patent No.: US 12,196,659 B2
(45) Date of Patent: Jan. 14, 2025

(54) MASS-SENSING INSTRUMENT WITH CAPACITIVE FEEDBACK PATH

(71) Applicant: The Board of Trustees of The University of Illinois, Urbana, IL (US)

(72) Inventors: Igor Paprotny, Chicago, IL (US); Mehdi Azadmehr, Horten (NO)

(73) Assignee: The Board of Trustees of the University of Illinois, Urbana, IL (US)

( * ) Notice: Subject to any disclaimer, the term of this patent is extended or adjusted under 35 U.S.C. 154(b) by 340 days.

(21) Appl. No.: 17/617,827

(22) PCT Filed: Jun. 26, 2020

(86) PCT No.: PCT/US2020/039739
§ 371 (c)(1),
(2) Date: Dec. 9, 2021

(87) PCT Pub. No.: WO2020/264242
PCT Pub. Date: Dec. 30, 2020

(65) Prior Publication Data
US 2022/0260474 A1   Aug. 18, 2022

Related U.S. Application Data (60) Provisional application No. 62/866,990, filed on Jun. 26, 2019.

(51) Int. Cl.
*G01N 15/06* (2024.01)
(52) U.S. Cl.
CPC .............................. *G01N 15/0606* (2013.01)

(58) Field of Classification Search
CPC .. G01G 3/13; G01G 3/16; G01N 5/02; G01N 15/0606
See application file for complete search history.

(56) References Cited

U.S. PATENT DOCUMENTS

| | | | | |
|---|---|---|---|---|
| 3,959,744 A | * | 5/1976 | O'Connor | G04F 5/06 368/200 |
| 4,788,466 A | * | 11/1988 | Paul | G01N 5/00 73/32 A |
| 5,422,605 A | * | 6/1995 | Yang | H03B 5/36 331/177 V |

(Continued)

FOREIGN PATENT DOCUMENTS

EP    1125117 A1    8/2001

OTHER PUBLICATIONS

PCT International Search Report and Written Opinion, Application No. PCT/US2020/039739, mailed Sep. 23, 2020, 12 pages.

*Primary Examiner* — Natalie Huls
(74) *Attorney, Agent, or Firm* — McDonnell Boehnen Hulbert & Berghoff LLP (57) ABSTRACT

The disclosure provides example mass-sensing instruments and methods for use thereof. A mass-sensing instrument includes a mass sensor that includes a first terminal and a second terminal. The mass sensor has a natural oscillation frequency configured to correspond to a mass of a deposited material on the mass sensor. The mass-sensing instrument also includes a first driving circuit configured to control a first voltage of the first terminal and a second driving circuit configured to control a second voltage of the second terminal.

20 Claims, 7 Drawing Sheets

(56) References Cited

U.S. PATENT DOCUMENTS

| | | | | |
|---|---|---|---|---|
| 7,183,868 | B1* | 2/2007 | Wessendorf | H03K 3/3545 |
| | | | | 331/158 |
| 7,362,193 | B2* | 4/2008 | Mattisson | H03B 5/36 |
| | | | | 331/158 |
| 9,515,605 | B1* | 12/2016 | Madala | H03B 5/32 |
| 10,036,730 | B2 | 7/2018 | Wilkinson et al. | |
| 2004/0020275 | A1* | 2/2004 | Paul | G01N 29/036 |
| | | | | 73/64.53 |
| 2004/0233008 | A1* | 11/2004 | Kobayashi | H03B 5/368 |
| | | | | 331/158 |
| 2007/0252475 | A1* | 11/2007 | Okaguchi | H03B 5/326 |
| | | | | 204/403.01 |
| 2013/0029350 | A1* | 1/2013 | Cooper | G01N 29/022 |
| | | | | 435/7.1 |
| 2014/0055203 | A1* | 2/2014 | Villard | G01H 13/00 |
| | | | | 331/25 |
| 2014/0087451 | A1 | 3/2014 | Therrien et al. | |
| 2016/0328637 | A1* | 11/2016 | Viikari | G06K 19/0723 |
| 2018/0328889 | A1* | 11/2018 | Hansen | G01N 5/02 |

\* cited by examiner

CONTROLLING A FIRST VOLTAGE OF A FIRST TERMINAL OF A MASS SENSOR VIA A FIRST DRIVING CIRCUIT AND CONTROLLING A SECOND VOLTAGE OF A SECOND TERMINAL OF THE MASS SENSOR VIA A SECOND DRIVING CIRCUIT, THEREBY CAUSING THE MASS SENSOR TO OSCILLATE AT A FREQUENCY INDICATIVE OF A MASS OF A MATERIAL THAT IS DEPOSITED ON THE MASS SENSOR

MASS-SENSING INSTRUMENT WITH CAPACITIVE FEEDBACK PATH

CROSS-REFERENCE TO RELATED APPLICATION

This application is a U.S. national phase of International Application No. PCT/US2020/039739, filed on Jun. 26, 2020, which claims priority to U.S. Provisional Application No. 62/866,990, filed Jun. 26, 2019, both of which are incorporated by reference herein in their entirety.

BACKGROUND

A particular type of mass-sensing resonator (MSR) includes a mass sensor (e.g., an oscillator) that exhibits a natural oscillation frequency that is indicative of a mass of particulate matter deposited on the mass sensor. As such, these MSRs can be used to monitor air quality. These conventional MSRs usually include a driving circuit that provides energy to the mass sensor to overcome electrical and mechanical loss mechanisms of the mass sensor. However, the performance of an MSR having a conventional driving circuit will generally degrade as the mass sensor continues to accumulate particulate matter thereon. Generally, enough particulate matter will eventually accumulate on the mass sensor such that the MSR will no longer operate. Additionally, conventional MSR driving circuits generate an undesirable amount of electrical noise.

SUMMARY

In a first aspect of the disclosure, an example mass-sensing instrument is disclosed. The mass-sensing instrument includes (a) a mass sensor comprising a first terminal and a second terminal, wherein the mass sensor has a natural oscillation frequency configured to correspond to a mass of a deposited material on the mass sensor; (b) a first driving circuit configured to control a first voltage of the first terminal; (c) and a second driving circuit configured to control a second voltage of the second terminal.

In a second aspect of the disclosure, an example method of operating a mass-sensing instrument is disclosed. The method includes (a) controlling a first voltage of a first terminal of a mass sensor via a first driving circuit and controlling a second voltage of a second terminal of the mass sensor via a second driving circuit, thereby causing the mass sensor to oscillate at a frequency indicative of a mass of a material that is deposited on the mass sensor.

When the term "substantially" or "about" is used herein, it is meant that the recited characteristic, parameter, or value need not be achieved exactly, but that deviations or variations, including, for example, tolerances, measurement error, measurement accuracy limitations, and other factors known to those of skill in the art may occur in amounts that do not preclude the effect the characteristic was intended to provide. In some examples disclosed herein, "substantially" or "about" means within +/−0-5% of the recited value.

These, as well as other aspects, advantages, and alternatives will become apparent to those of ordinary skill in the art by reading the following detailed description, with reference where appropriate to the accompanying drawings. Further, it should be understood that this summary and other descriptions and figures provided herein are intended to illustrate the invention by way of example only and, as such, that numerous variations are possible.

DETAILED DESCRIPTION

The present disclosure advantageously provides a mass-sensing instrument with improved operating lifetime and reduced electrical noise. Examples of such mass-sensing instruments and methods for using them are discussed in the present disclosure.

Within examples, a mass-sensing instrument includes a mass sensor that includes a first terminal and a second terminal. The mass-sensing instrument can take the form of a surface acoustic wave device or a film bulk acoustic resonator, for example. The mass sensor (e.g., a piezoelectric oscillator) has a natural oscillation frequency configured to correspond to a mass of a deposited material on the mass sensor. In other words, as material accumulates on the mass sensor, the natural oscillation frequency will generally decrease. The mass-sensing instrument further includes a first driving circuit configured to control a first voltage of the first terminal and a second driving circuit configured to control a second voltage of the second terminal. The first driving circuit and the second driving circuit store and provide energy that is used to overcome electrical and mechanical loss mechanisms of the mass sensor. This "double-ended" or "push-pull" configuration can help extend the operating lifetime of the mass-sensing instrument and reduce electrical noise. That is, the first driving circuit and the second driving circuit both drive the mass sensor from opposite terminals of the mass sensor.

Figure 1:
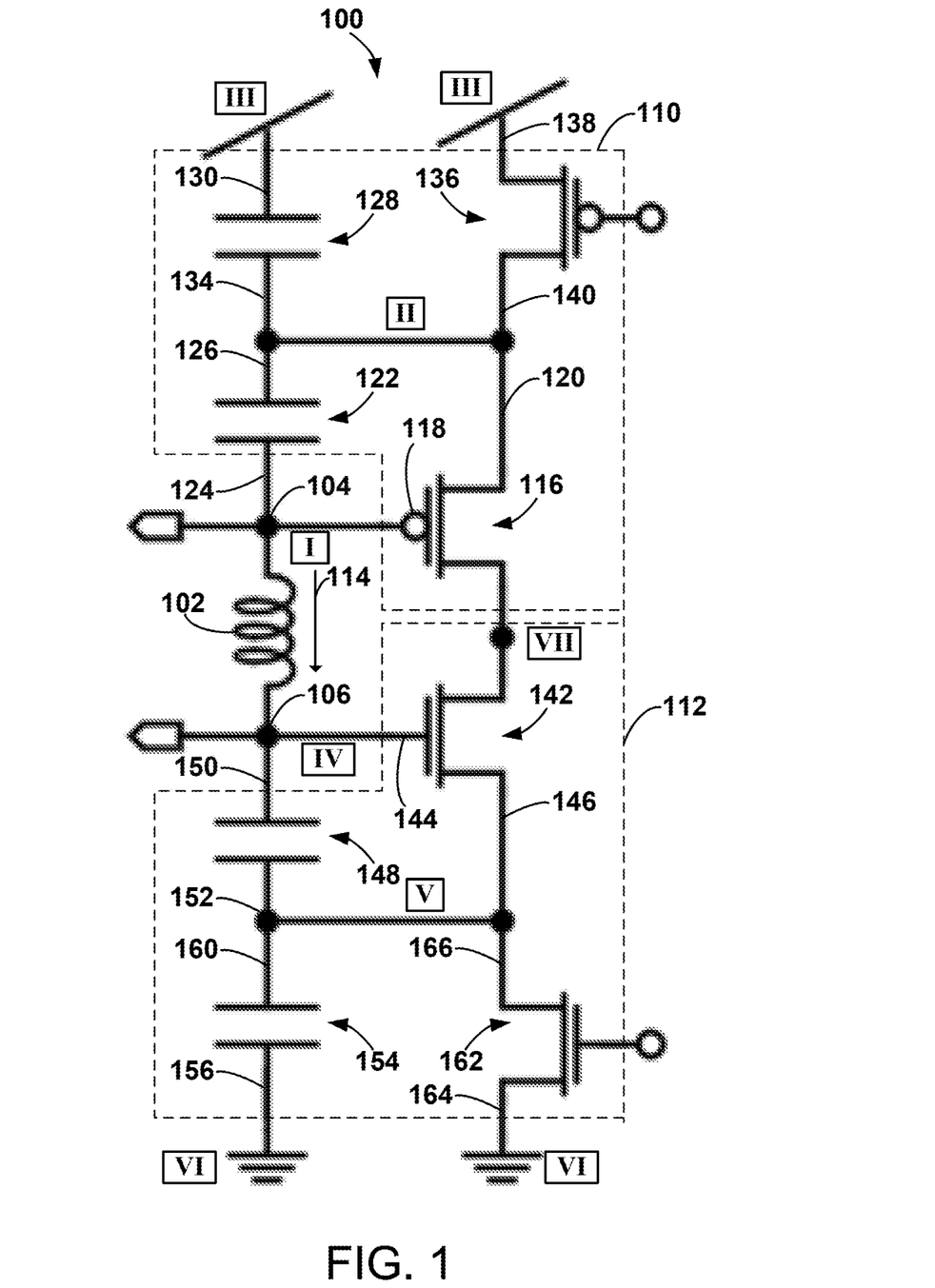
FIG. 1 is a schematic diagram of a mass-sensing instrument, according to one example implementation.

FIG. 1 is a schematic diagram of a mass-sensing instrument 100. The mass-sensing instrument 100 includes a mass sensor 102 that includes a first terminal 104 and a second terminal 106. The mass sensor 102 has a natural oscillation frequency configured to correspond to a mass of a deposited material (e.g., particulate matter) on the mass sensor 102. The mass-sensing instrument 100 also includes a first driving circuit 110 configured to control a first voltage of the first terminal 104 and a second driving circuit 112 configured to control a second voltage of the second terminal 106. In some examples, the mass-sensing instrument 100 is an air-microfluidic-based particulate matter sensing instrument.

The mass sensor 102 can take the form of a surface-acoustic wave sensor or a thin-film acoustic resonator, for example. The mass sensor 102 will generally include a piezoelectric material that can generate an electric field in response to a mechanical stress that is applied to the mass sensor 102 or can generate mechanical stress within the mass sensor 102 in response to an electric field that is applied to the mass sensor 102. The mass sensor 102 can generally be electrically modeled as an inductive element as in FIG. 1, but could also be modeled as a network of resistive and/or capacitive components in addition to at least one inductive component.

The oscillating voltage between the first terminal 104 and the second terminal 106 can be monitored using an oscilloscope or a multimeter to determine the natural oscillating frequency of the mass sensor 102. The natural oscillating frequency of the mass sensor 102 generally decreases monotonically with respect to an increasing total mass of the mass sensor 102 and the material deposited thereon. As such, the natural oscillating frequency of the mass sensor 102 can serve as a proxy for an amount of particulate matter that is deposited on the mass sensor 102 over time.

In FIG. 1, the first driving circuit 110 is a common-drain oscillator. The first driving circuit 110 includes a first amplifier 116 having a first input terminal 118 that forms a first node I with the first terminal 104 of the mass sensor 102. The first amplifier 116 also includes a first output terminal 120. The first amplifier 116 is shown as a metal oxide semiconductor field effect transistor (MOSFET), but other examples are possible. More specifically, the first amplifier 116 is shown as a p-type MOSFET (PMOS). In operation, the first amplifier 116 generates a small-signal alternating current (AC) voltage between the first output terminal 120 and a small signal AC ground (e.g., a seventh node VII) that is proportional to the small signal AC voltage between the first input terminal 118 and the small signal ground. That is, the first amplifier 116 acts as a common-drain amplifier.

The first driving circuit 110 also includes a first capacitor 122 that includes (i) a third terminal 124 that forms the first node I and (ii) a fourth terminal 126 that forms a second node II with the first output terminal 120. The first capacitor 122 serves as a feedback path from output to input for the first amplifier 116.

The first driving circuit 110 also includes a second capacitor 128 that includes (i) a fifth terminal 130 that forms a third node III and (ii) a sixth terminal 134 that forms the second node II. A positive or negative terminal of a power supply could also be connected to the third node III, but other examples are possible.

The first driving circuit 110 also includes a first transistor 136 that includes a first drain terminal 138 that forms the third node III and a first source terminal 140 that forms the second node II. The first transistor 136 serves as a direct current (DC) source of current to bias the first amplifier 116 within the linear region. The first transistor 136 is a PMOS transistor.

In FIG. 1, the second driving circuit 112 is a common-drain oscillator. The second driving circuit 112 includes a second amplifier 142 having a second input terminal 144 that forms a fourth node IV with the second terminal 106 of the mass sensor 102. The second amplifier 142 also includes a second output terminal 146. The second amplifier 142 is shown as an NMOS transistor, but other examples are possible. The second amplifier 142 generates a small-signal alternating current (AC) voltage between the second output terminal 146 and small signal ground (e.g., the seventh node VII) that is proportional to the small signal AC voltage between the second input terminal 144 and the small signal ground.

The second driving circuit 112 also includes a third capacitor 148 that includes (i) a seventh terminal 150 that forms the fourth node IV and (ii) an eighth terminal 152 that forms a fifth node V with the second output terminal 146. The third capacitor 148 serves as a feedback path from output to input for the second amplifier 142.

The second driving circuit 112 also includes a fourth capacitor 154 that includes (i) a ninth terminal 156 that forms a sixth node VI and (ii) a tenth terminal 160 that forms the fifth node. A positive or negative terminal of a power supply could also be connected to the sixth node VI, but other examples are possible.

The second driving circuit 112 also includes a second transistor 162 comprising a second drain 164 terminal that forms the sixth node and a second source terminal 166 that forms the fifth node. The second transistor 162 serves as a direct current (DC) source of current to bias the second amplifier 142 within the linear region. The second transistor 162 is an NMOS transistor.

Throughout an oscillation period of the mass sensor 102, a first energy stored by the first driving circuit 110 is substantially equal to a second energy stored by the second driving circuit 112. Additionally, throughout an oscillation period of the mass sensor 102, a total energy stored by the mass sensor 102, the first driving circuit 110, and the second driving circuit 112 is constant. During operation, energy is transferred from the mass sensor 102 collectively to the first capacitor, the second capacitor, the third capacitor, and the fourth capacitor. An oscillation period of the mass sensor 102 is completed when the energy is transferred back to the mass sensor 102 as described in more detail below.

FIG. 1 depicts the first driving circuit 110 and the second driving circuit 112 collectively forcing positive current 114 through the mass sensor 102 from the first terminal 104 to the second terminal 106 during a first portion of an oscillation period of the mass sensor 102. At a particular instant, the positive current 114 is at a maximum, the energy stored by the mass sensor 102 is at a maximum, and the energy collectively stored by the first driving circuit 110 and the second driving circuit 112 is at a minimum (e.g., zero).

Figure 2:
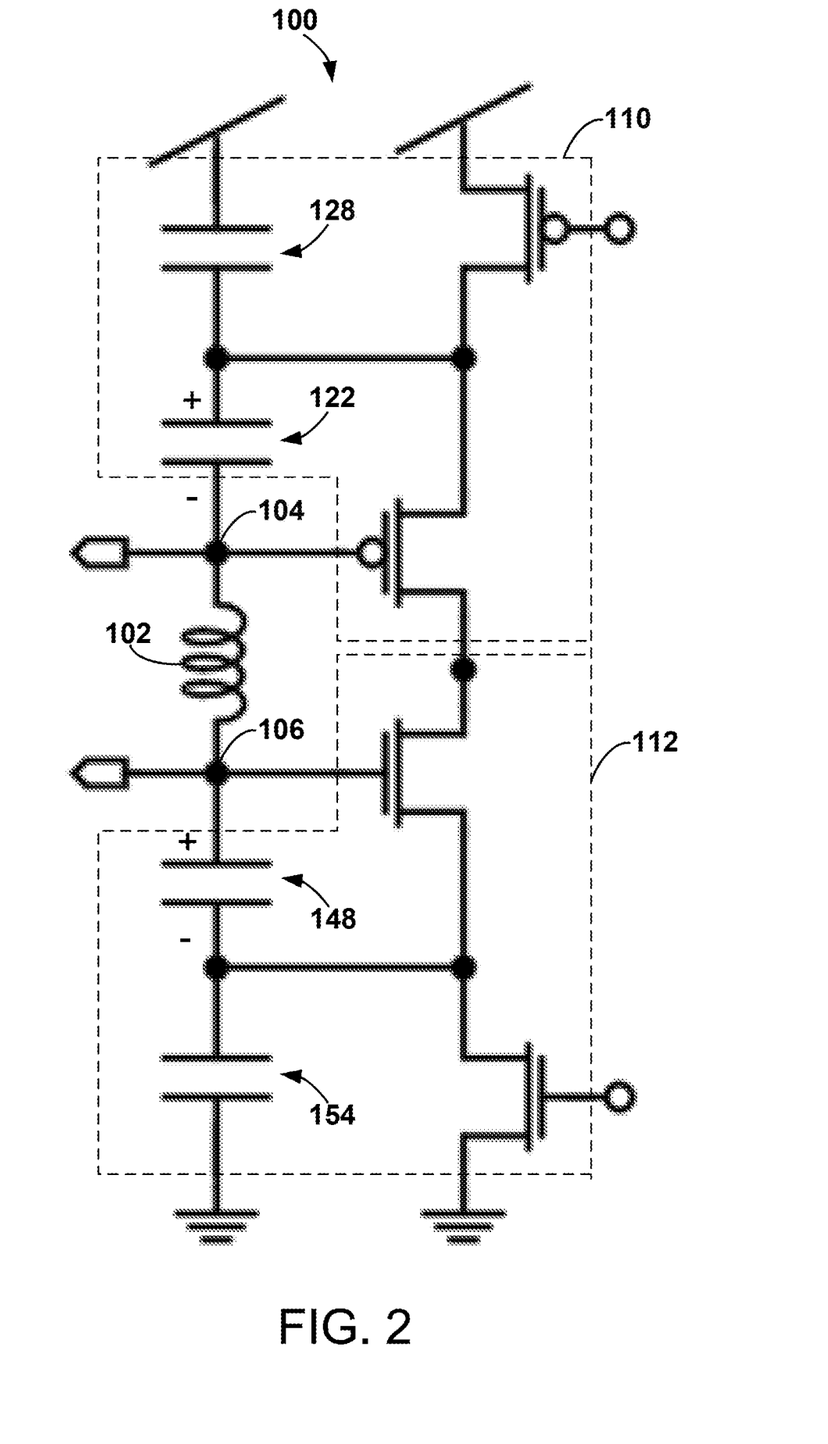
FIG. 2 is a schematic diagram of a mass-sensing instrument, according to the example implementation of FIG. 1.

FIG. 2 depicts an end point of the first portion of the oscillation period of the mass sensor 102. In FIG. 2, there is zero current flow through the mass sensor 102, the mass sensor 102 stores a minimum amount of energy (e.g., zero), and the first driving circuit 110 and the second driving circuit 112 collectively store a maximum amount of energy. For example, the first capacitor 122 stores energy with the polarity shown and the third capacitor 148 stores energy with the polarity shown.

Figure 3:
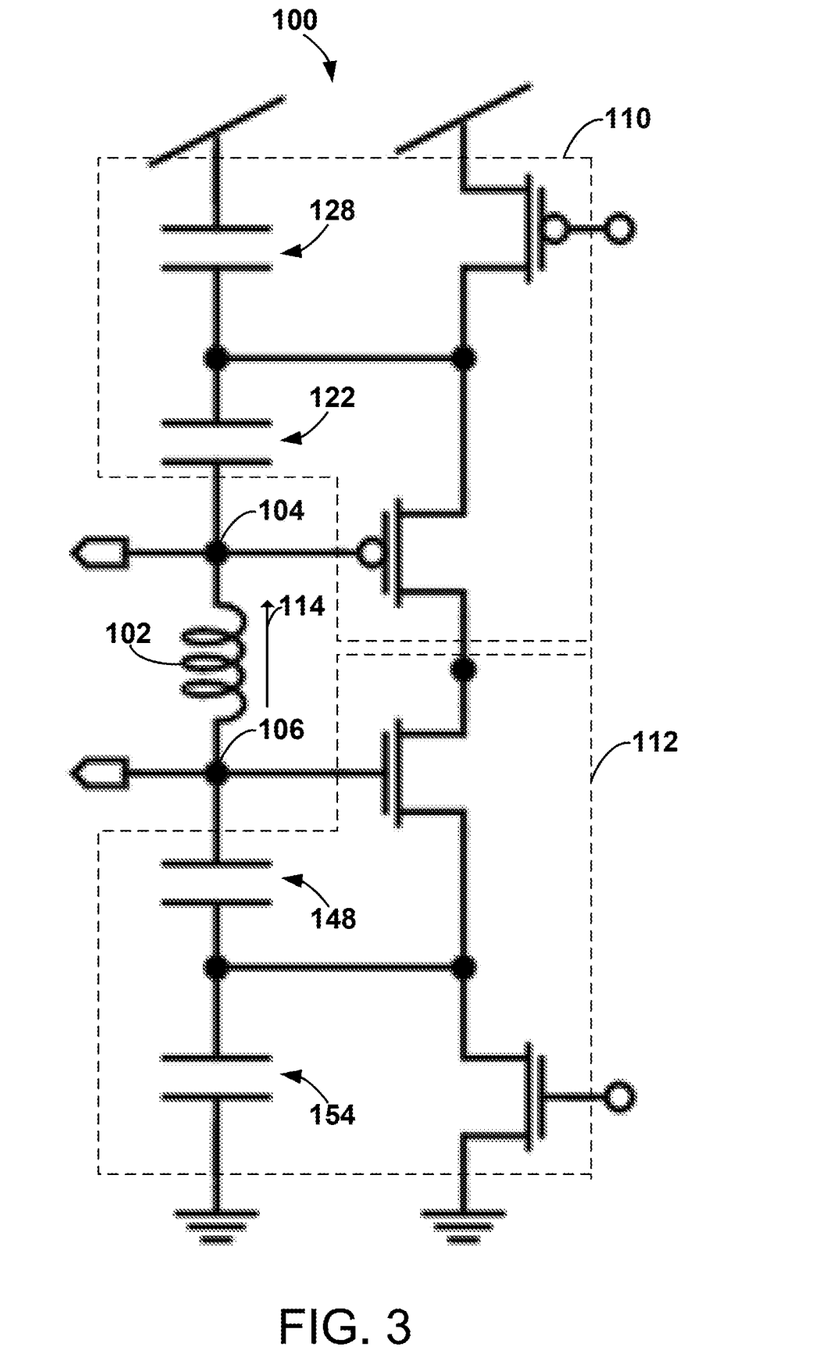
FIG. 3 is a schematic diagram of a mass-sensing instrument, according to the example implementation of FIG. 1.

FIG. 3 depicts the first driving circuit 110 and the second driving circuit 112 collectively forcing positive current 114 through the mass sensor 102 from the second terminal 106 to the first terminal 104 during a second portion of the oscillation period of the mass sensor 102 that follows the first portion. At a particular instant, the positive current 114 is at a maximum in a direction opposite that shown in FIG. 1, the energy stored by the mass sensor 102 is at a maximum, and the energy collectively stored by the first driving circuit 110 and the second driving circuit 112 is at a minimum (e.g., zero).

Figure 4:
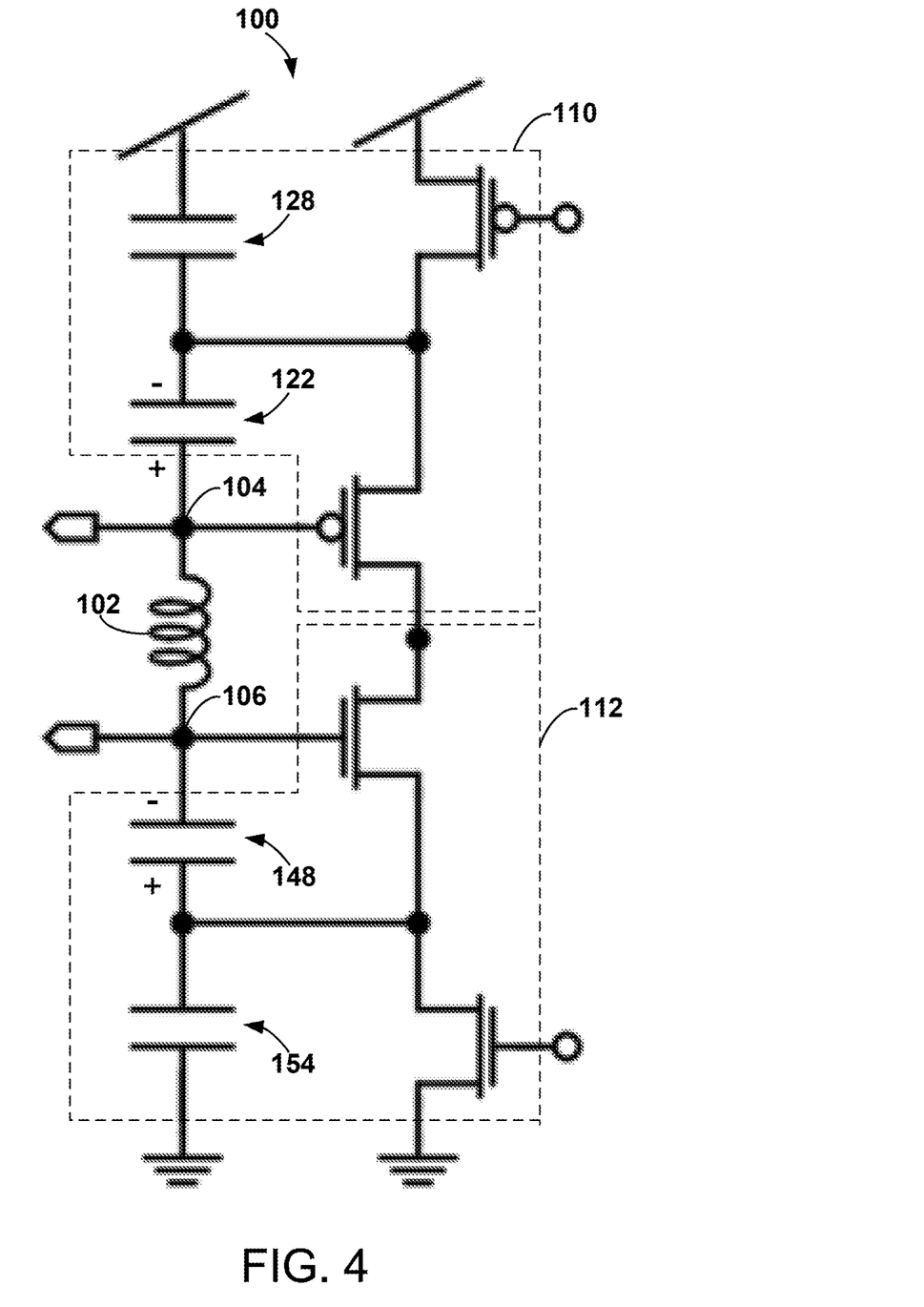
FIG. 4 is a schematic diagram of a mass-sensing instrument, according to the example implementation of FIG. 1.

FIG. 4 depicts an end point of the second portion of the oscillation period of the mass sensor 102. In FIG. 4, there is zero current flow through the mass sensor 102, the mass sensor 102 stores a minimum amount of energy (e.g., zero), and the first driving circuit 110 and the second driving circuit 112 collectively store a maximum amount of energy. For example, the first capacitor 122 stores energy with the polarity shown and the third capacitor 148 stores energy with the polarity shown.

Figure 5:
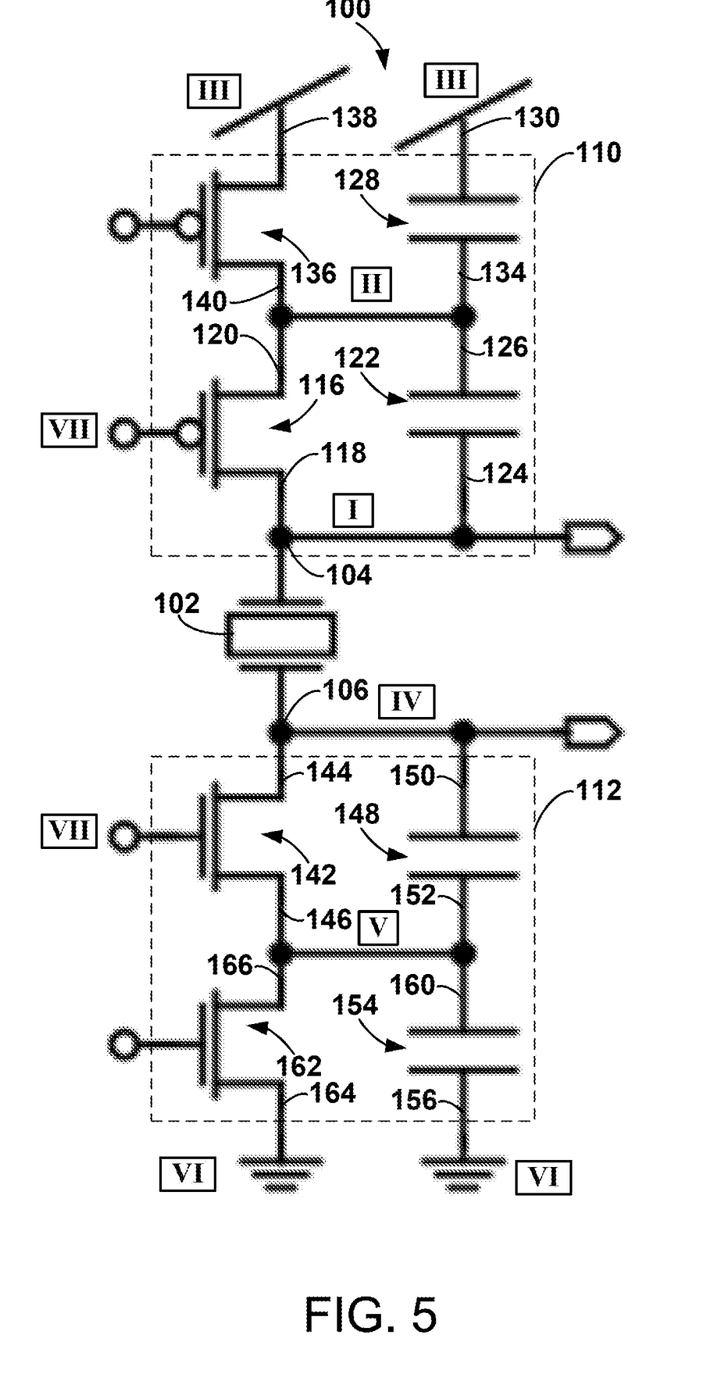
FIG. 5 is a schematic diagram of a mass-sensing instrument, according to one example implementation.

FIG. 5 is a schematic diagram of another example of the mass-sensing instrument 100. In FIG. 5, the first amplifier 116 and the second amplifier 142 operate in a common-gate configuration, but otherwise the mass-sensing instrument 100 shown in FIG. 5 is functionally and structurally similar to or the same as the mass-sensing instrument 100 shown in FIG. 1.

Figure 6:
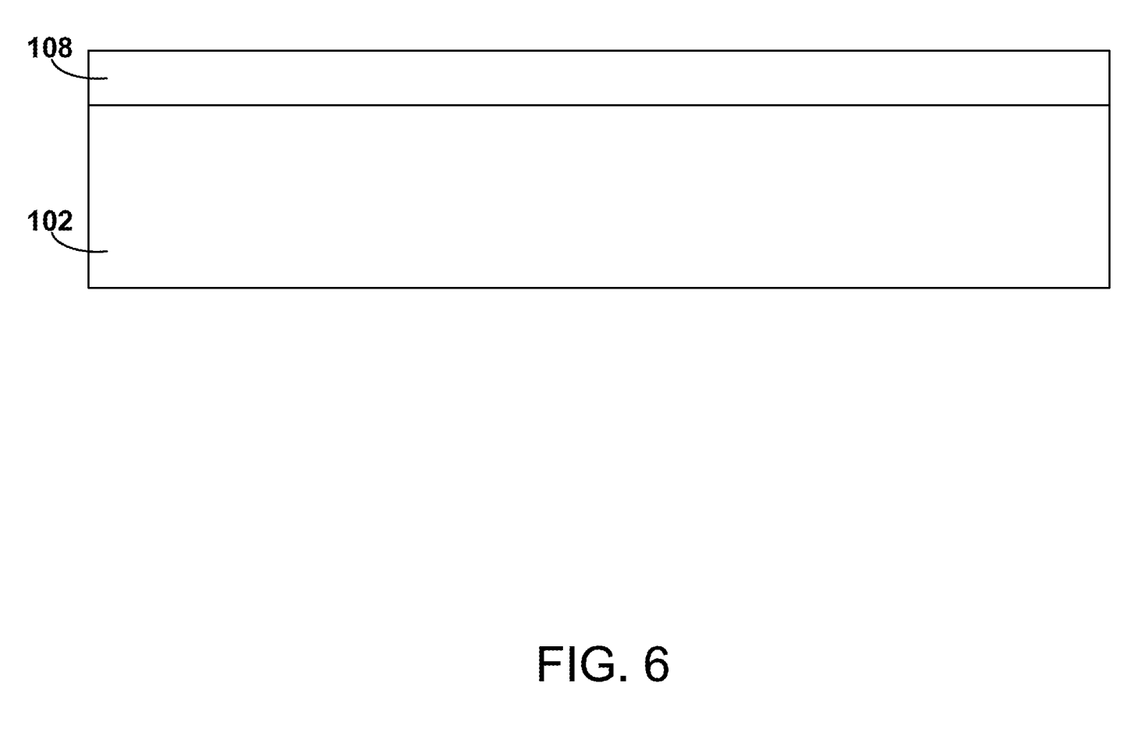
FIG. 6 is a schematic diagram of a mass sensor and a deposited material, according to one example implementation.

FIG. 6 is a schematic diagram of the mass sensor 102 and a deposited material 108. As a thickness and/or a mass of the deposited material 108 (e.g., particulate matter) increases, the natural oscillation frequency of the mass sensor 102 will monotonically decrease.

Figure 7:
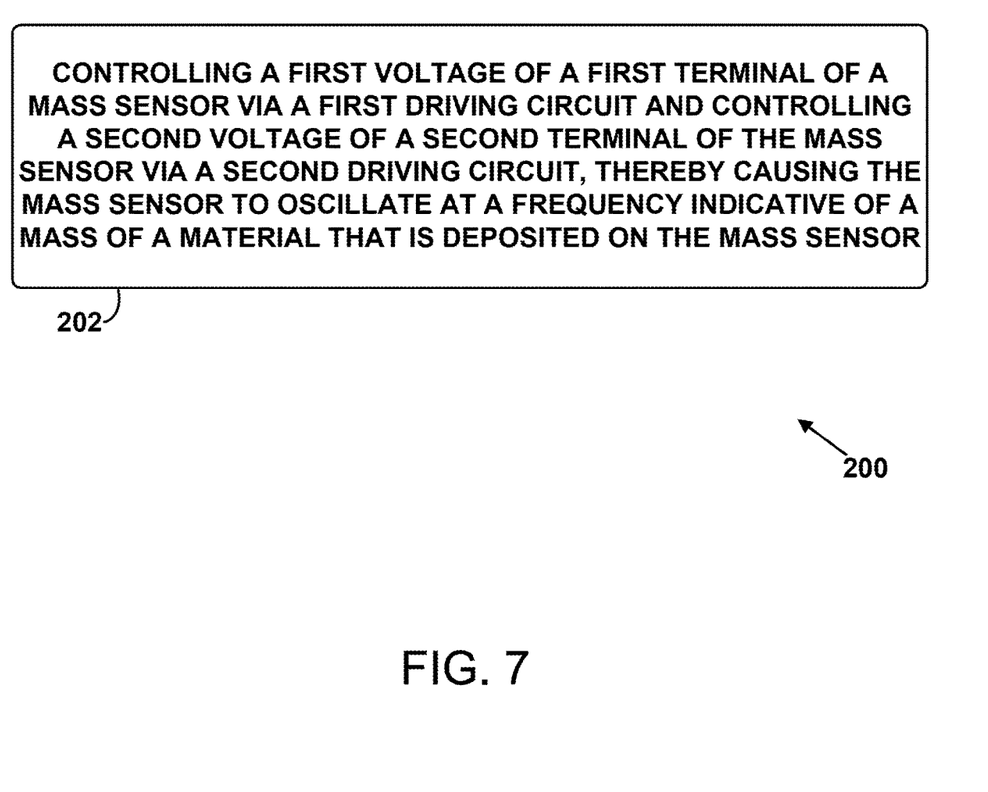
FIG. 7 is block diagram of a method, according to one example implementation.

FIG. 7 is a block diagram of a method 200 of operating the mass-sensing instrument 100.

At block 202, the method 200 includes controlling the first voltage of the first terminal 104 of the mass sensor 102 via the first driving circuit 110 and controlling the second voltage of the second terminal 106 of the mass sensor 102 via the second driving circuit 112, thereby causing the mass sensor 102 to oscillate at a frequency indicative of a mass of the material 108 that is deposited on the mass sensor 102.

For example, controlling the first voltage of the first terminal 104 can include forcing positive current 114 through the mass sensor 102 from the first terminal 104 to the second terminal 106 during a first portion of an oscillation period of the mass sensor 102 and forcing positive current 114 through the mass sensor 102 from the second terminal 106 to the first terminal 104 during a second portion of the oscillation period of the mass sensor 102.

Additionally, controlling the second voltage of the second terminal 106 can include forcing positive current 114 through the mass sensor 102 from the first terminal 104 to the second terminal 106 during the first portion of the oscillation period of the mass sensor 102 and forcing positive current 114 through the mass sensor 102 from the second terminal 106 to the first terminal 104 during the second portion of the oscillation period of the mass sensor 102.

While various example aspects and example embodiments have been disclosed herein, other aspects and embodiments will be apparent to those skilled in the art. The various example aspects and example embodiments disclosed herein are for purposes of illustration and are not intended to be limiting, with the true scope and spirit being indicated by the following claims.

What is claimed is:

1. A mass-sensing instrument comprising:
   a mass sensor comprising a first terminal and a second terminal, wherein the mass sensor has a natural oscillation frequency configured to correspond to a mass of a deposited material on the mass sensor;
   a first driving circuit configured to control a first voltage of the first terminal, the first driving circuit comprising:
      a first amplifier having (i) a first input terminal that forms a first node with the first terminal of the mass sensor and (ii) a first output terminal; and
      a capacitive feedback path comprising (i) a third terminal that forms the first node and (ii) a fourth terminal that forms a second node with the first output terminal; and
   a second driving circuit configured to control a second voltage of the second terminal.

2. The mass-sensing instrument of claim 1, wherein the mass sensor comprises a surface-acoustic wave sensor.

3. The mass-sensing instrument of claim 1, wherein the mass sensor comprises a thin-film acoustic resonator.

4. The mass-sensing instrument of claim 1, wherein the first driving circuit is a common-drain oscillator.

5. The mass-sensing instrument of claim 4, wherein the second driving circuit is a common-drain oscillator.

6. The mass-sensing instrument of claim 1, wherein the first driving circuit is a common-gate oscillator.

7. The mass-sensing instrument of claim 6, wherein the second driving circuit is a common-gate oscillator.

8. The mass-sensing instrument of claim 1, wherein the first driving circuit is configured to force positive current through the mass sensor from the first terminal to the second terminal during a first portion of an oscillation period of the mass sensor and to force positive current through the mass sensor from the second terminal to the first terminal during a second portion of the oscillation period of the mass sensor.

9. The mass-sensing instrument of claim 8, wherein the second driving circuit is configured to force positive current through the mass sensor from the first terminal to the second terminal during the first portion of the oscillation period of the mass sensor and to force positive current through the mass sensor from the second terminal to the first terminal during the second portion of the oscillation period of the mass sensor.

10. The mass-sensing instrument of claim 1, wherein the capacitive feedback path is a first capacitor.

11. The mass-sensing instrument of claim 10, the first driving circuit further comprising:
    a second capacitor comprising (i) a fifth terminal that forms a third node and (ii) a sixth terminal that forms the second node.

12. The mass-sensing instrument of claim 11, the first driving circuit further comprising:
    a first transistor comprising a first drain terminal that forms the third node and a first source terminal that forms the second node.

13. The mass-sensing instrument of claim 10, the second driving circuit comprising:
    a second amplifier having (i) a second input terminal that forms a fourth node with the second terminal of the mass sensor and (ii) a second output terminal; and
    a third capacitor comprising (i) a seventh terminal that forms the fourth node and (ii) an eighth terminal that forms a fifth node with the second output terminal.

14. The mass-sensing instrument of claim 13, the second driving circuit further comprising:
    a fourth capacitor comprising (i) a ninth terminal that forms a sixth node and (ii) a tenth terminal that forms the fifth node.

15. The mass-sensing instrument of claim 14, the second driving circuit further comprising:
    a second transistor comprising a second drain terminal that forms the sixth node and a second source terminal that forms the fifth node.

16. A method of operating a mass-sensing instrument, the method comprising:
    controlling a first voltage of a first terminal of a mass sensor via a first driving circuit and controlling a second voltage of a second terminal of the mass sensor via a second driving circuit, thereby causing the mass sensor to oscillate at a frequency indicative of a mass of a material that is deposited on the mass sensor, wherein controlling the first voltage comprises:
       using an amplifier to generate a third voltage that is proportional to the first voltage; and
       providing the third voltage to the first terminal via a capacitive feedback path.

17. The method of claim 16, wherein controlling the first voltage comprises forcing positive current through the mass sensor from the first terminal to the second terminal during a first portion of an oscillation period of the mass sensor and forcing positive current through the mass sensor from the second terminal to the first terminal during a second portion of the oscillation period of the mass sensor.

18. The method of claim 16, wherein throughout an oscillation period of the mass sensor a first energy stored by the first driving circuit is substantially equal to a second energy stored by the second driving circuit.

19. The method of claim 16, wherein controlling the second voltage comprises:
  using a second amplifier to generate a fourth voltage that is proportional to the second voltage; and
  providing the fourth voltage to the second terminal via a second capacitive feedback path.

20. A mass-sensing instrument comprising:
  a mass sensor comprising a first terminal and a second terminal, wherein the mass sensor has a natural oscillation frequency configured to correspond to a mass of a deposited material on the mass sensor;
  a first driving circuit configured to control a first voltage of the first terminal, the first driving circuit comprising:
  a first amplifier having (i) a first input terminal that forms a first node with the first terminal of the mass sensor and (ii) a first output terminal; and
  a first capacitor comprising (i) a third terminal that forms the first node and (ii) a fourth terminal that forms a second node with the first output terminal; and
  a second driving circuit configured to control a second voltage of the second terminal.

\* \* \* \* \*